(12) United States Patent
Araki et al.

(10) Patent No.: US 7,847,417 B2
(45) Date of Patent: Dec. 7, 2010

(54) FLIP-CHIP MOUNTING SUBSTRATE AND FLIP-CHIP MOUNTING METHOD

(75) Inventors: Yasushi Araki, Nagano (JP); Seiji Sato, Nagano (JP); Masatoshi Nakamura, Nagano (JP); Takashi Ozawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 458 days.

(21) Appl. No.: 11/613,753

(22) Filed: Dec. 20, 2006

(65) Prior Publication Data

US 2007/0145553 A1 Jun. 28, 2007

(30) Foreign Application Priority Data

Dec. 22, 2005 (JP) ............... 2005-369714
Dec. 8, 2006 (JP) ............... 2006-332444

(51) Int. Cl.
*H01L 23/02* (2006.01)
(52) U.S. Cl. ............... 257/778; 438/106; 438/107; 438/108; 438/118; 438/119; 257/E21.511
(58) Field of Classification Search ............... 257/738, 257/778, E21.511, E21.503; 438/613
See application file for complete search history.

(56) References Cited

U.S. PATENT DOCUMENTS

| 5,889,326 | A | * | 3/1999 | Tanaka | 257/737 |
| 7,112,524 | B2 | * | 9/2006 | Hsu et al. | 438/614 |
| 7,420,282 | B2 | * | 9/2008 | Iwane et al. | 257/778 |
| 2005/0006789 | A1 | * | 1/2005 | Tomono et al. | 257/778 |
| 2006/0065978 | A1 | * | 3/2006 | Nishiyama et al. | 257/737 |
| 2006/0081999 | A1 | * | 4/2006 | Iwane et al. | 257/778 |

FOREIGN PATENT DOCUMENTS

| JP | 2001-332584 | | 11/2001 |
| JP | 2001332584 | * | 11/2001 |

* cited by examiner

*Primary Examiner*—Leonardo Andújar
*Assistant Examiner*—William Harriston
(74) *Attorney, Agent, or Firm*—Rankin, Hill & Clark LLP

(57) ABSTRACT

A solder resist and a central pad to which a central Au bump provided on a semiconductor chip is flip-chip bonded are formed on a substrate main body. In a flip-chip mounting substrate where an underfill resin is provided after the semiconductor chip is mounted, a central opening portion for exposing the central pad is formed in the solder resist, and also, an edge portion forming the central opening portion of the solder resist is partially overlapped with the outer peripheral portion of the central pad.

6 Claims, 14 Drawing Sheets

FLIP-CHIP MOUNTING SUBSTRATE AND FLIP-CHIP MOUNTING METHOD

This application claims foreign priorities based on Japanese Patent application No. 2005-369714, filed Dec. 22, 2005, and Japanese Patent application No. 2006-332444, filed Dec. 8, 2006, the contents of which are incorporated herein by reference in their entireties.

BACKGROUND OF THE INVENTION

1. Field of the Invention

The present invention relates to a flip-chip mounting substrate and a flip-chip mounting method. More specifically, the present invention is directed to a flip-chip mounting substrate and a flip-chip mounting method in which a semiconductor element is flip-chip mounted by using an Au (gold) bump.

2. Description of the Related Art

Recently, mounting structures have been widely utilized in which an electronic element (for example, semiconductor element) is flip-chip bonded to connecting pads formed on a flip-chip mounting substrate by using a bonding material while employing Au bumps on the electronic element as external connecting terminals (for instance, refer to JP-A-2001-332584).

FIG. 1 shows one example of a semiconductor chip 1 which is to be flip-chip mounted. FIG. 2 shows one example of a flip-chip mounting substrate 5 on which the semiconductor chip 1 is to be flip-chip mounted. FIG. 1 shows a circuit formed surface 1a of the semiconductor chip 1, and the semiconductor chip 1 is flip-chip mounted in a face-down manner so that the circuit formed surface 1a faces the flip-chip mounting substrate 5.

Outer peripheral Au bumps 2 and central Au bumps 3 which are gold bumps are formed on the circuit formed surface 1a of the semiconductor chip 1. The outer peripheral Au bumps 2 are arranged on the circuit formed surface 1a in a peripheral shape. Also, the central Au bumps 3 are formed at a central position of the circuit formed surface 1a. In the related art, in a semiconductor element in which Au bumps are employed as external connecting terminals, a general structure is to arrange the Au bumps in a peripheral shape. However, a total number of terminals is increased as a density of recent semiconductor elements becoming higher. As a consequence, the central Au bumps 3 are arranged also at the central position of the circuit formed surface 1a.

In connection to the above-explained structures, the flip-chip mounting substrate 5 on which the semiconductor chip 1 is flip-chip mounted also has a structure in which outer peripheral pads 7 corresponding to the outer peripheral Au bumps 2 and central pads 8 corresponding to the central Au bumps 3 are provided. Also, a solder resist 10 (indicated by satin finished surface) is provided on an upper surface side of the semiconductor chip 1 on the flip-chip mounting substrate 5, and openings are formed in the solder resist 10 at positions in which the respective pads 7 and 8 are formed so that these pads 7 and 8 are exposed.

In the related art, as to the outer peripheral pads 7 to which the outer peripheral Au bumps 2 arranged in the peripheral shape are flip-chip mounted, a frame-shaped opening portion 11 having a frame shape is formed in the solder resist 10. As a consequence, all of the outer peripheral pads 7 are positioned within this frame-shaped opening portion 11. On the other hand, as to the central pads 8 positioned at the center, central opening portions 12 are formed in the solder resist 10 with respect to each of these central pads 8.

After bonding materials (for example, solder) are provided on the respective pads 7 and 8, the semiconductor chip 1 of the above-described structure is flip-chip mounted on the flip-chip mounting substrate 5. Then, after the flip-chip mounting, an underfill resin is provided in a separated portion between the semiconductor chip 1 and the flip-chip mounting substrate 5. This underfill resin is provided in order to prevent stresses caused by a thermal expansion difference between the semiconductor chip 1 and the flip-chip mounting substrate 5 from being applied between the respective Au bumps 2, 3 and the respective pads 7, 8. Since this underfill resin is provided, mounting reliability between the semiconductor chip 1 and the flip-chip mounting substrate 5 can be increased.

FIG. 3 is a sectional view showing a state after the semiconductor chip 1 is mounted on the flip-chip mounting substrate 5 and before the underfill resin is provided. More specifically, FIG. 3 shows a portion in an enlarged manner, which is in vicinity of a portion where the outer peripheral Au bump 2 is flip-chip mounted to the outer peripheral pad 7. As shown in this drawing, the outer peripheral Au bump 2 is flip-chip mounted via solder 14 to the outer peripheral pad 7, and the outer peripheral pad 7 is positioned within the frame-shaped opening portion 11 formed in the solder resist 10.

In order to provide an underfill resin 15 at a flip-chip mounting position between the outer peripheral Au bump 2 and the outer peripheral pad 7, as shown by an arrow of a broken line in FIG. 3, the underfill resin 15 is filled from a gap between an outer peripheral edge 1b of the semiconductor chip 1 and the flip-chip mounting substrate 5 into a bonding position (namely, within the frame-shaped opening portion 11) of the outer peripheral Au bump 2 and the outer peripheral bump 7.

The bonding position of the outer peripheral Au bump 2 and the outer peripheral pad 7 is located near the outer peripheral edge 1b of the semiconductor chip 1. As a consequence, a process of filling the underfill resin 15 into the bonding position (namely, within the frame-shaped opening portion 11) of the outer peripheral Au bump 2 and the outer peripheral pad 7 could be smoothly and easily carried out. Also, the underfill resin 15 entered into the frame-shaped opening portion 11 moves along the frame-shaped opening portion 11, so that the bonding position of the outer peripheral Au bump 2 and the outer peripheral pad 7, which is within the frame-shaped opening portion 11, could be firmly sealed by the underfill resin 15.

However, currently the following problems occur. That is, since the central Au bumps 3 are provided at the central position of the circuit formed surface 1a of the semiconductor chip 1, and the central Au bumps 3 are bonded to the central pads 8, voids 16 (refer to FIG. 7) are frequently generated at the position where the underfill resin 15 is provided. Referring now to FIGS. 4A to 7B, a description is made of a reason why the voids 16 are generated near the flip-chip bonding positions of the central Au bumps 3 and the central pads 8 in the related art.

FIGS. 4A and 4B show the flip-chip mounting substrate 5 before the semiconductor chip 1 is mounted, and more specifically, shows a portion in vicinity of the central pads 8 in an enlarged manner. FIG. 4A is a sectional view taken along an arrow line A-A of FIG. 4B.

As explained above, central opening portions 12 are provided for each of the central pads 8. Also, the central pad 8 is of a shape having a wide width portion 8a and a narrow width portion 8b. In the related art, the central opening portion 12 is formed larger with respect to the central pad 8, and a separated portion 6a (namely, a portion indicated by an arrow W2 in FIG. 4A) is formed between the central pad 8 and the edge portion of the central opening portion 12. In this separated portion 6a, a surface of a substrate main body 6 (flip-chip mounting substrate 5) is exposed. As a consequence, a depth of the central opening portion 12 becomes a distance measured from an upper face of a solder resist 10 to an upper face of the substrate main body 6 (namely, a thickness of the solder resist 10, which is represented by an arrow H2 in FIG. 4A).

FIGS. 5A and 5B show a state in which a solder 14 as a bonding material is provided on the upper face of the central pad 8. This solder 14 is provided only on the upper portion of the central pad 8, so that the separated portion 6a is still present within the central opening portion 12.

Also, FIGS. 6A and 6B show a state in which the central Au bump 3 is flip-chip bonded via the solder 14 to the central pad 8, and the semiconductor chip 1 is flip-chip mounted on the flip-chip mounting substrate 5. Even in this flip-chip mounting state, the separated portion 6a is present within the central opening portion 12.

Also, FIGS. 7A and 7B show a state in which the underfill resin 15 is provided between the flip-chip mounted semiconductor chip 1 and the flip-chip mounting substrate 5.

As previously explained with reference to FIG. 3, the process of sealing the bonding position of the outer peripheral Au bump 2 and the outer peripheral pad 7 by the underfill resin 15 could be easily and firmly carried out. This is because since the outer peripheral Au bumps 2 are arranged at the outer peripheral position of the semiconductor chip 1, the underfill resin 15 could be filled into the separated portion between the semiconductor chip 1 and the flip-chip mounting substrate 5 from the outer peripheral edge 1b.

In contract thereto, the bonding position of the central Au bump 3 formed at the central position of the semiconductor chip 1 and the central pad 8 is sealed by such a way that the underfill resin 15 filled from the outer peripheral edge 1b of the semiconductor chip 1 flows up to the bonding position of the central Au bump 3 and the central pad 8.

However, when the underfill resin 15 flows up to the bonding position (namely, a position where the central opening portion 12 is formed in the solder resist 10) of the central Au bump 3 and the central pad 8, as shown by an arrow shown in FIG. 7B, such a phenomenon has occurred that the underfill resin 15 flows to the peripheral portion of the central opening portion 12 ahead of the internal portion of this central opening portion 12, without flowing into the internal portion of the central opening portion 12.

As explained above, when the underfill resin 15 does not flow into the internal portion of the central opening portion 12, then the central Au bump 3 and the central pad 8 are not held by the underfill resin 15. Thus, the stress caused by the thermal expansion difference between the semiconductor chip 1 and the flip-chip mounting substrate 5 is directly applied to the bonding position. As a result, the mounting reliability is lowered.

Also, the void (air gap) 16 is formed around the bonding position of the central Au bump 3 and the central pad 8. When a heat application process operation or the like is subsequently performed, the void 16 is thermally expanded. Accordingly, there are such problems that the bonding of the central Au bump 3 and the central pad 8 is damaged, and cracks are made in the solder resist 10, the underfill resin 15 and the like.

SUMMARY OF THE INVENTION

The present invention has been made in view of the above circumstances, and provides a flip-chip mounting substrate and a flip-chip mounting method in which mounting reliability is increased by suppressing an occurrence of a void.

In some implementations, a flip-chip mounting substrate of the invention, comprising:
a substrate main body;
a solder resist on the substrate main body; and
a connecting pad to which an Au bump provided on an electronic element is flip-chip bonded, the connecting pad being provided on the substrate main body,
wherein the solder resist has an opening portion for exposing the connecting pad, and an edge portion of the opening portion of the solder resist is partially overlapped with an outer peripheral portion of the connecting pad.

Further, in some implementations, a flip-chip mounting substrate of the invention, comprising:
a substrate main body;
a solder resist on the substrate main body; and
a connecting pad to which an Au bump provided on an electronic element is flip-chip bonded, the connecting pad being provided on the substrate main body,
wherein the solder resist has an opening portion for exposing the connecting pad, and
an edge portion of the opening portion of the solder resist is substantially in contact with an outer peripheral edge of the connecting pad.

In accordance with the above-described flip-chip mounting substrate of the invention, in the opening portion of the solder resist for exposing the connecting pad, such a structure is arranged that the edge portion of the opening portion of the solder resist is partially overlapped with the outer peripheral portion of the connecting pad, or the edge portion of the opening portion of the solder resist is substantially in contact with the outer peripheral edge of the connecting pad. As a result, the depth of the opening portion becomes such a depth defined from the upper face of the solder resist up to the upper face of the connecting pad, and thus, becomes shallower than the depth defined from the upper face of the solder resist up to the surface of the substrate main body, as explained in the related flip-chip mounting substrate. As a consequence, when the underfill resin is provided, the underfill resin can easily enter into the opening portion, and it is possible to avoid that the void is generated in the underfill resin.

In the flip-chip mounting substrate, a bonding material for connecting the Au bump and the connecting pad fills up the opening portion formed in the solder resist when the Au bump and the connecting pad are connected.

In accordance with the above-described invention, since the opening portion formed in the solder resist is filled up with the bonding material when the Au bump and the connecting pad are connected, no concave portion (opening portion) is formed on the substrate main body. As a result, it is possible to avoid that the opening portion disturbs the flows of the underfill resin. Thus, the underfill resin can flow smoothly, and it is possible to prevent the void from being generated in the underfill resin.

In the flip-chip mounting substrate, the connecting pad of which outer peripheral portion is partially overlapped with the edge portion of the opening portion of the solder resist is provided at a central position of an area where the electronic element is mounted.

In the flip-chip mounting substrate, the connecting pad of which outer peripheral edge is substantially in contact with the edge portion of the opening portion of the solder resist is provided at a central position of an area where the electronic element is mounted.

In accordance with the above-described invention, even when the Au bump is provided at the central position of the electronic element, it is possible to suppress the generation of voids in the underfill resin. As a result, it is possible to arrange the Au bump at the central position of the electronic element, so that the Au bumps can be arranged on the electronic element in high density.

In some implementations, a flip-chip mounting method of the invention for flip-chip mounting an electronic element on which an Au bump is provided, the flip-chip mounting method comprising:

providing a bonding material on the connecting pad which is exposed from the opening portion formed in the solder resist of the flip-chip mounting substrate as described above;

bonding the Au bump and the connecting pad via the bonding material so as to mount the electronic element on the flip-chip mounting substrate; and providing an underfill resin in a gap between the electronic element and the flip-chip mounting substrate.

In accordance with the present invention, the underfill resin can flow smoothly, and it is possible to prevent the void from being generated within the underfill resin.

DESCRIPTION OF THE PREFERRED EMBODIMENTS

Next, a description is made of best modes for carrying out the invention with reference to drawings. Au bumps used herein are gold bumps which are formed by wire-bonding of Au wire.

Figure 1:
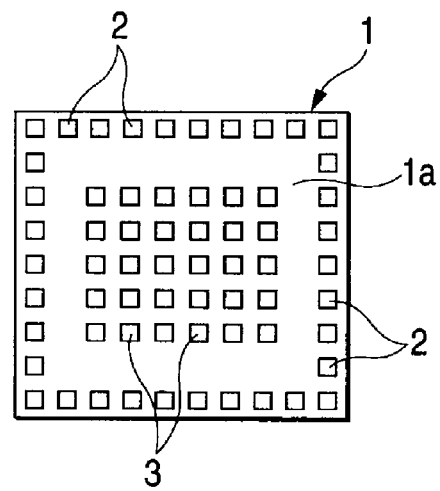
FIG. 1 is a bottom view for explaining arranging positions of Au bumps of a semiconductor chip.
Figure 8A:
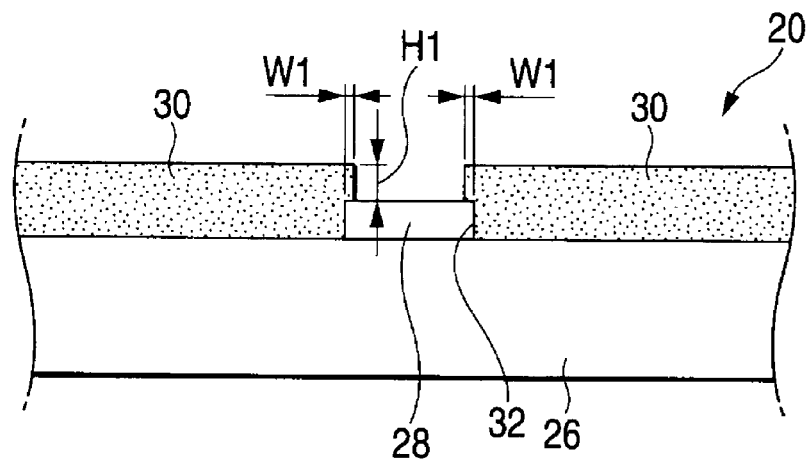
FIG. 8A is a diagram for explaining a structure of a flip-chip mounting substrate according to a first embodiment of the present invention, and is a sectional view near a central pad.
Figure 8B:
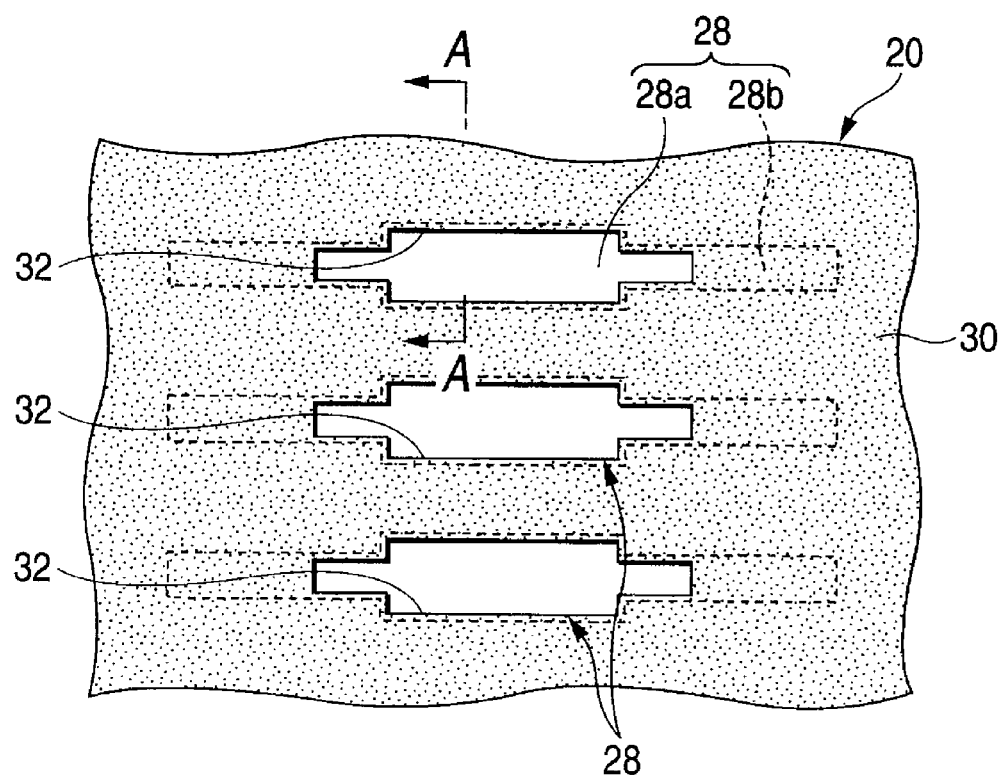
FIG. 8B is a diagram for explaining a structure of a flip-chip mounting substrate according to a first embodiment of the present invention, and is a plan view near the central pad.
Figure 9A:
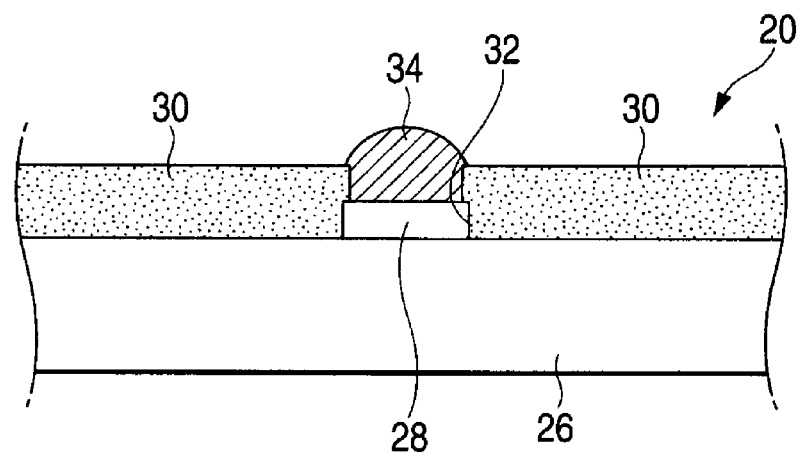
FIG. 9A is a diagram for showing such a condition that a solder is provided on the central pad of the flip-chip mounting substrate according to a first embodiment of the present invention, and is a sectional view near the central pad.
Figure 9B:
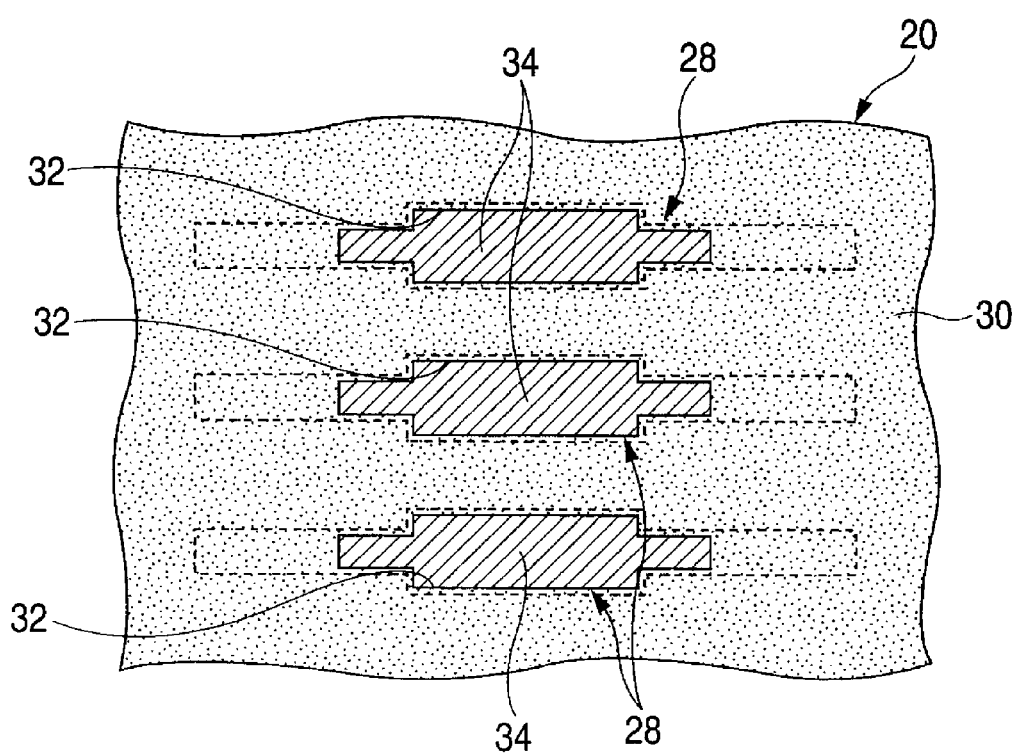
FIG. 9B is a diagram for showing such a condition that a solder is provided on the central pad of the flip-chip mounting substrate according to a first embodiment of the present invention, and is a plan view near the central pad.

FIGS. 8A and 8B show a flip-chip mounting substrate 20 according to a first embodiment of the present invention. This flip-chip mounting substrate 20 corresponds to such a substrate on which the semiconductor chip 1 that is manufactured in high density by forming the outer peripheral Au bumps 2 and the central Au bumps 3 on the circuit formed surface 1a is flip-chip mounted, as shown in FIG. 1.

Figure 2:
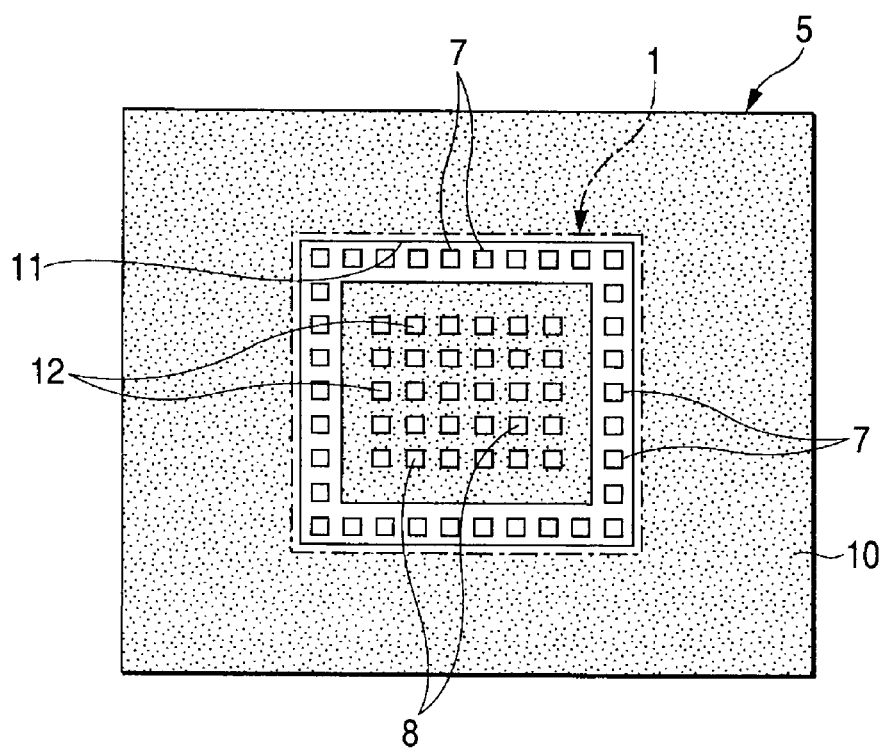
FIG. 2 is a plan view for showing one example of a flip-chip mounting substrate on which the semiconductor chip indicated in FIG. 1 is mounted.
Figure 3:
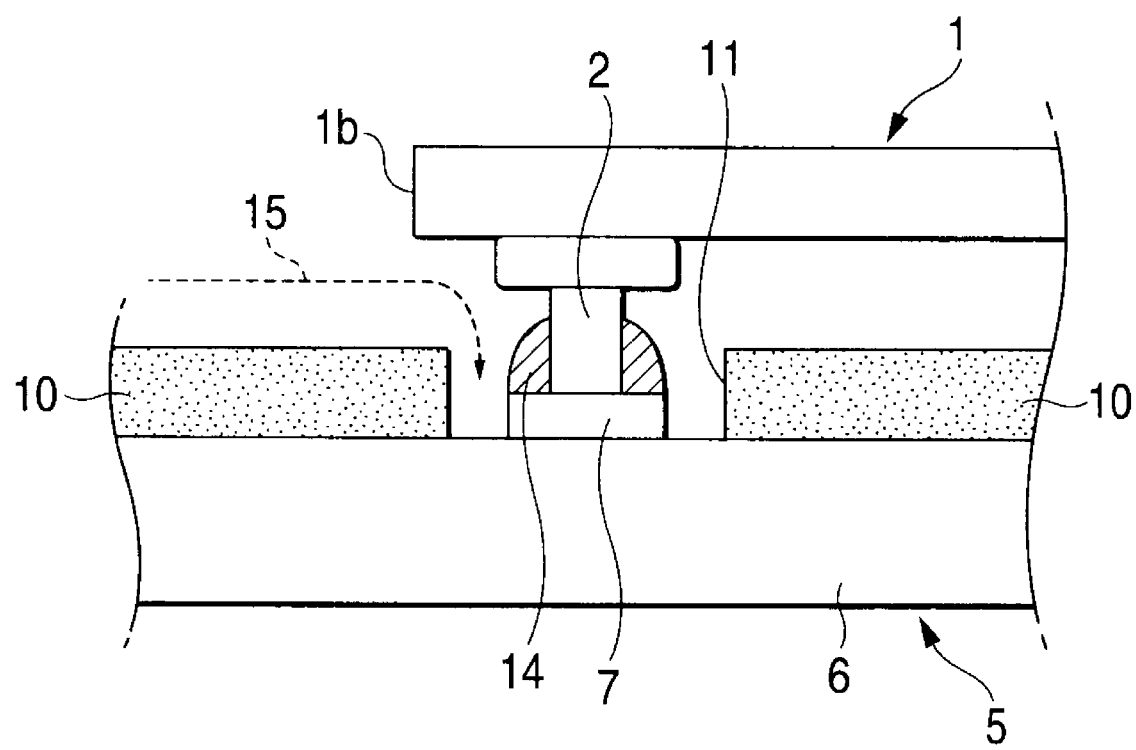
FIG. 3 is a sectional view for explaining a filling operation of an underfill resin with respect to a flip-chip bonding position of an outer peripheral Au bump 2.

FIG. 8A is a sectional view of the flip-chip mounting substrate 20, taken along a line A-A of FIG. 8B. Also, since an external appearance of the flip-chip mounting substrate 20 as a plan view is substantially equivalent to the external appearance of the flip-chip mounting substrate 5 shown in FIG. 2, the external appearance of the flip-chip mounting substrate 20 is not shown.

The flip-chip mounting substrate 20 according to the embodiment is mainly provided with a substrate main body 26, central pads 28, a solder resist 30, and so on. The substrate main body 26 is made of a resin material, and wiring patterns are formed on an upper portion of this substrate main body 26. For the sake of convenience, in the drawing, only such central pads 28 which are flip-chip bonded with the central Au bumps 3 are illustrated among the wiring patterns.

The solder resist 30 is provided for protecting a portion where a soldering process is not carried out among the wiring patterns formed on the substrate main body 26. In the solder resist 30, a central opening portion 32 is formed.

The central opening portion 32 is formed at an arranging position of the central pad 28 on which the central Au bump 3 is flip-chip mounted. As a result, the central pad 28 is brought into such a state that the central pad 28 is externally exposed at the position where the central opening portion 32 is formed. As described later, the central Au bump 3 of the semiconductor chip 1 is flip-chip mounted on the central pad 28 exposed from this central opening portion 32. This central pad 28 has a wide width portion 28a and a narrow width portion 28b.

In this case, in the flip-chip mounting substrate 20 according to this embodiment, an edge portion forming the central opening portion 32 of the solder resist 30 is partially overlapped with an outer peripheral portion of the central pad 28. Specifically, as indicated in FIG. 8A, in the present embodiment, the edge portion forming the central opening portion 32 of the solder resist 30 is extended so as to get on the upper portion of the central pad 28. As a result, both the central pad 28 and the solder resist 30 are overlapped with each other only within a range represented by an arrow W1 in this drawing (central pad 28 and solder resist 30 are overlapped with each other in a condition of plan view).

Figure 4A:
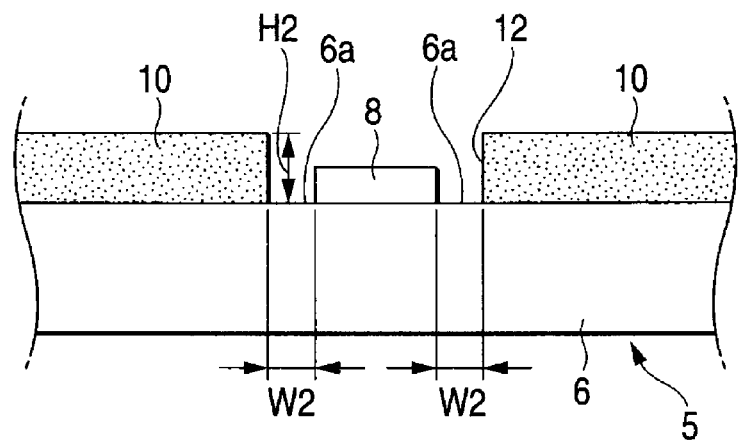
FIG. 4A is a diagram for explaining one example of a structure of a flip-chip mounting substrate of a related art, and is a sectional view near the central pad.
Figure 4B:
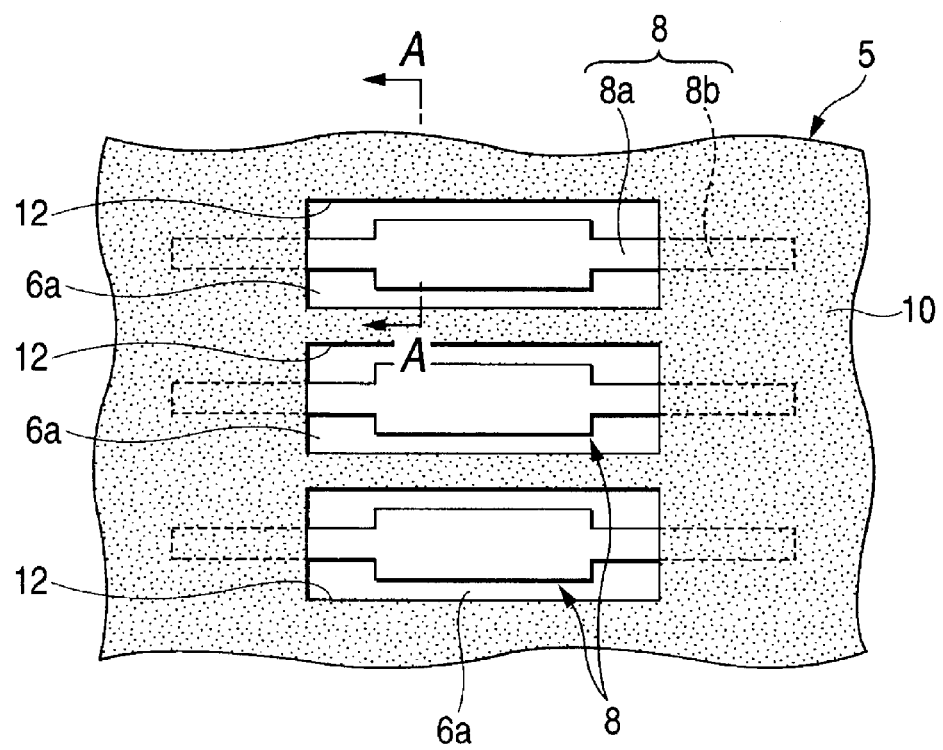
FIG. 4B is a diagram for explaining one example of a structure of a flip-chip mounting substrate of a related art, and is a plan view near the central pad.
Figure 5A:
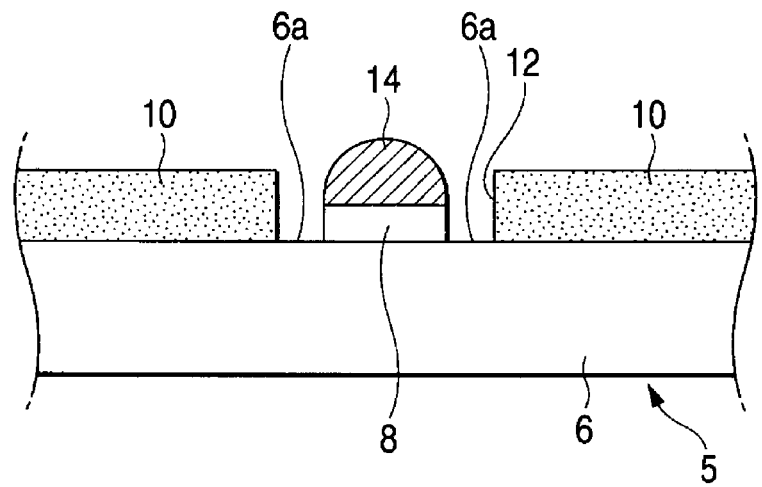
FIG. 5A is a diagram for showing such a condition that a solder is provided on the central pad of the flip-chip mounting substrate as one example of the related art, and is a sectional view near the central pad.
Figure 5B:
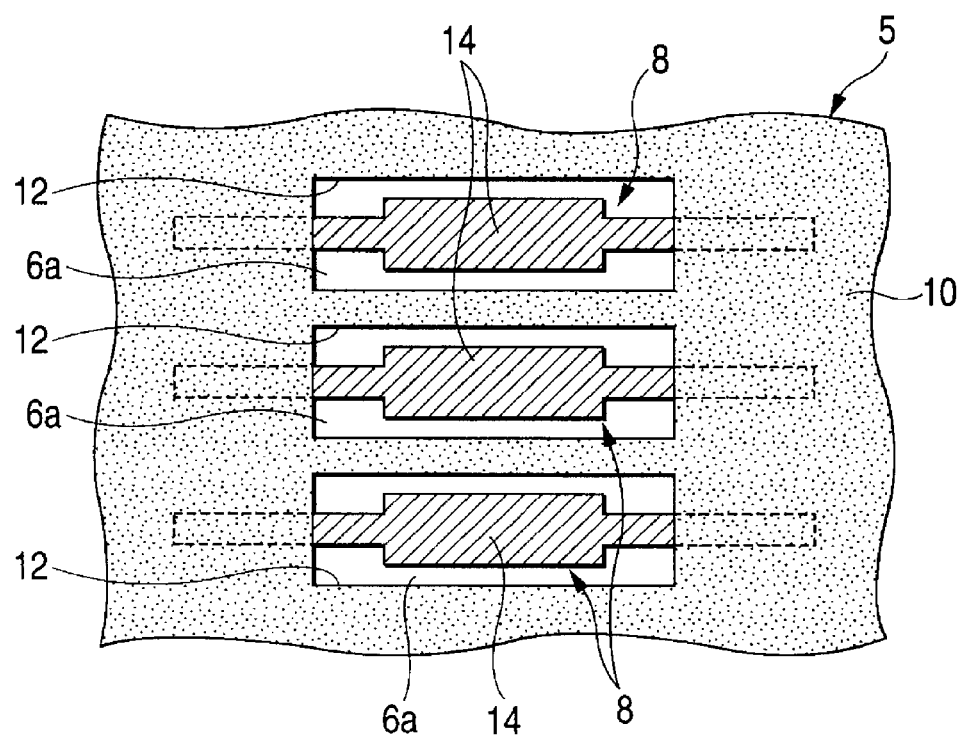
FIG. 5B is a diagram for showing such a condition that a solder is provided on the central pad of the flip-chip mounting substrate as one example of the related art, and is a plan view near the central pad.
Figure 6A:
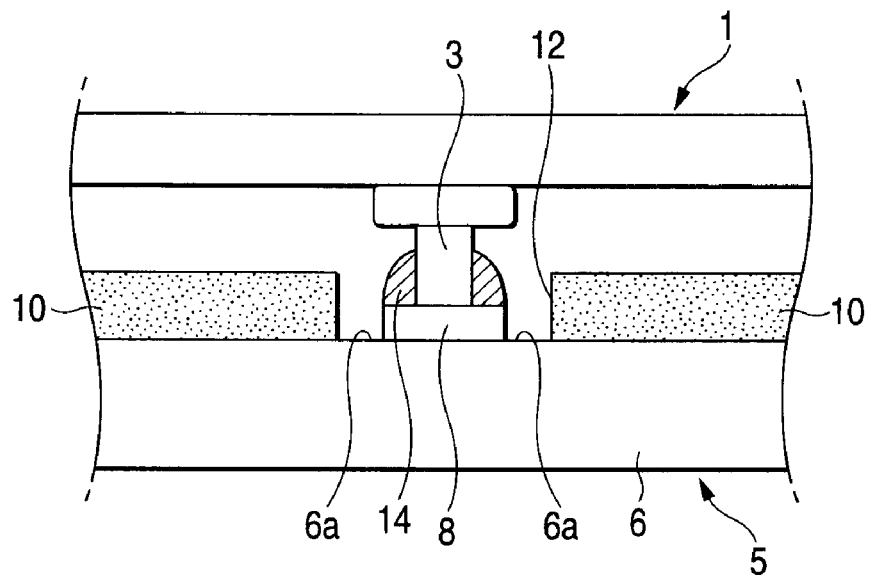
FIG. 6A is a diagram for showing such a condition that the central Au bump is bonded to the flip-chip mounting substrate as one example of the related art, and is a sectional view near the central pad.
Figure 6B:
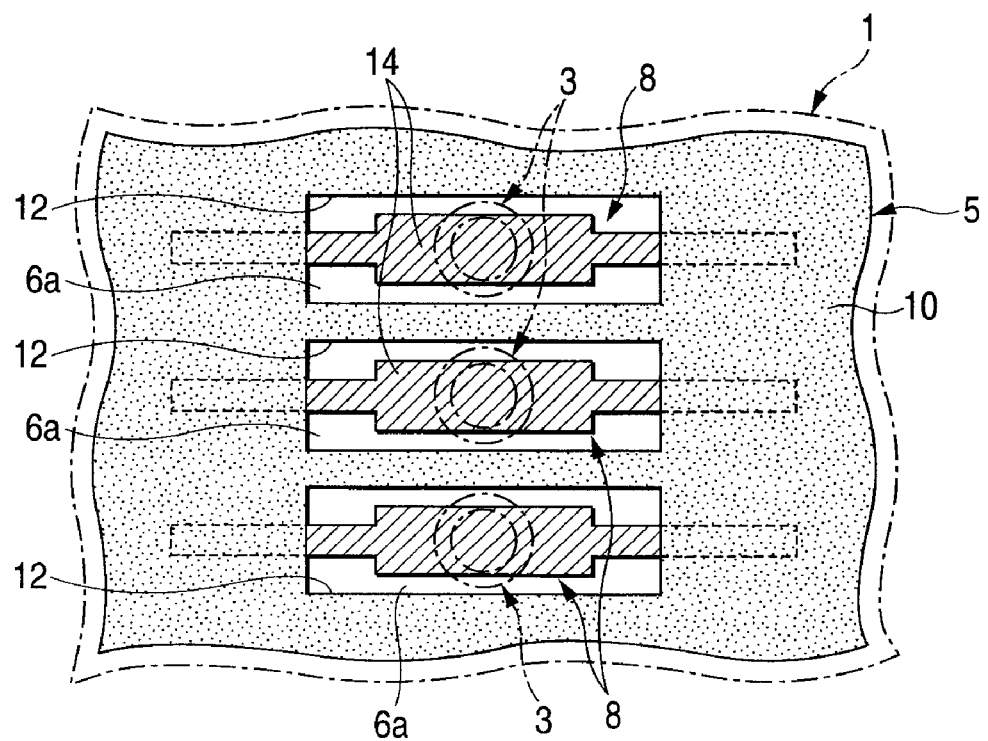
FIG. 6B is a diagram for showing such a condition that the central Au bump is bonded to the flip-chip mounting substrate as one example of the related art, and is a plan view near the central pad.

Since the above-explained structure is employed, a depth (indicated by arrow H1 in FIG. 8A) of the central opening portion 32 becomes such a depth defined from the upper face of the solder resist 30 up to the upper face of the central pad 28. Thus, this depth of the central opening portion 32 can be made shallower than the depth H2 (refer to FIG. 4A) defined from the upper face of the solder resist 10 up to the surface of the substrate main body 6 in the related art (H1<H2).

Next, a description is made of a method for flip-chip mounting the semiconductor chip 1 on the flip-chip mounting substrate 20 by using the flip-chip mounting substrate 20 formed by the above-explained structure. FIG. 9A to FIG. 11B show the method for flip-chip mounting the semiconductor chip 1 on the flip-chip mounting substrate 20 in accordance with a mounting procedure. In FIG. 9A to FIG. 11B, the same reference numerals shown in FIG. 1, FIGS. 8A and 8B will be employed as those for denoting the same structural elements in FIG. 9A to FIG. 11B, and therefore, explanations thereof are omitted.

In flip-chip mounting the semiconductor chip 1 on the flip-chip mounting substrate 20, the solder 34 as the bonding material is firstly provided on the upper face of the central pad 28. The solder 34 may be provided on the central pad 28 by using, for example, a screen printing method.

This solder 34 is provided over an entire face (including both wide width portion 28a and narrow width portion 28b) of the central pad 28. Under the condition that this solder 34 is provided, in this embodiment, the central opening portion 32 is completely filled up with the solder 34 (namely, central opening portion 32 is infilled). The solder 34 need not cover the entire face of the central pad 28. (Refer to FIGS. 9A and 9B)

As previously explained, when the solder 34 is provided on the central pad 28, the central Au bump 3 is subsequently positioned on the central pad 28. Subsequently, application of heat and pressure is performed from a back surface of the semiconductor chip 1, and heat is transferred to the solder 34 via the central Au bump 3 so that the solder 34 melts. Then, the central Au bump 3 is flip-chip bonded to the central pad 28 via the solder 34. In addition, flip-chip bonding of the central Au bump 3 and the central pad 28 may be performed by a reflow process by using a solder paste.

Figure 10A:
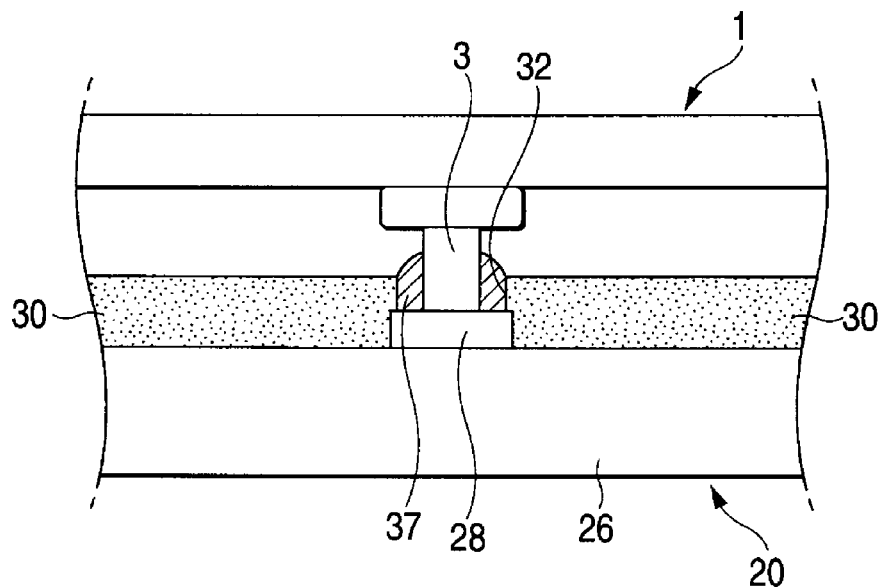
FIG. 10A is a diagram for showing such a condition that the central Au bump is bonded to the flip-chip mounting substrate according to a first embodiment of the invention, and is a sectional view near the central pad.
Figure 10B:
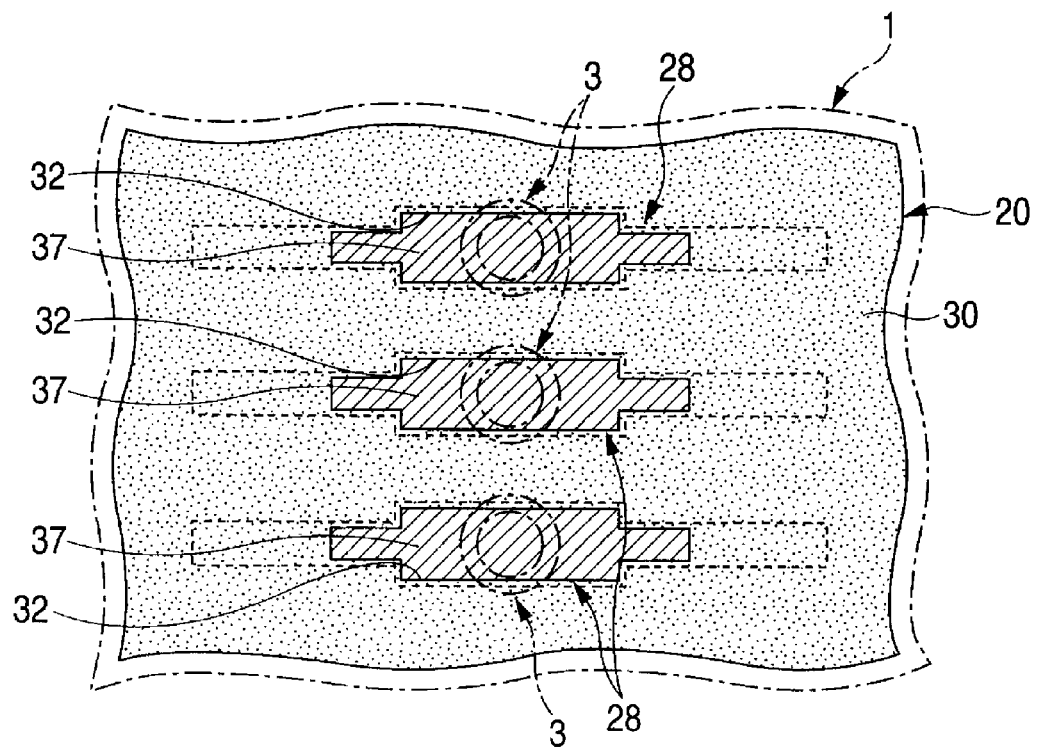
FIG. 10B is a diagram for showing such a condition that the central Au bump is bonded to the flip-chip mounting substrate according to a first embodiment of the invention, and is a plan view near the central pad.
Figure 11A:
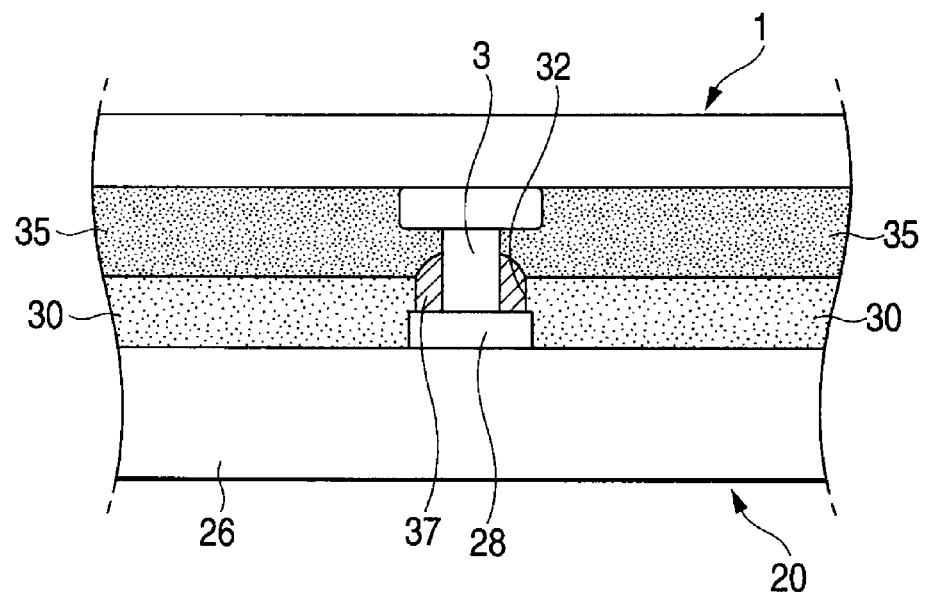
FIG. 11A is a diagram for showing such a condition that an underfill resin is provided to the flip-chip mounting substrate according to a first embodiment of the invention, and is a sectional view near the central pad.
Figure 11B:
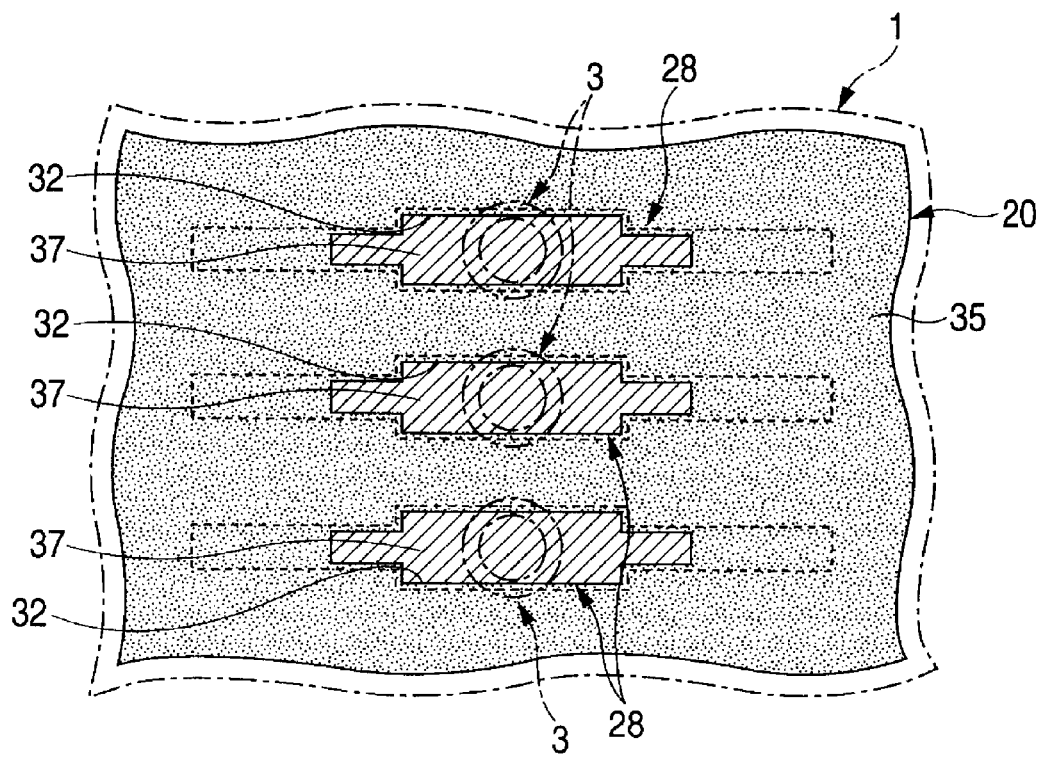
FIG. 11B is a diagram for showing such a condition that an underfill resin is provided to the flip-chip mounting substrate according to a first embodiment of the invention, and is a plan view near the central pad.

As a result, as represented in FIGS. 10A and 10B, the semiconductor chip 1 is flip-chip mounted on the flip-chip mounting substrate 20. Under this condition, the solder 34 covers the central opening portion 32, and a part of this solder 37 is positioned on the upper portion of the solder resist 30.

As explained above, when the semiconductor chip 1 is flip-chip mounted on the flip-chip mounting substrate 20, an underfill resin 35 is subsequently provided to a separated portion (gap) between the semiconductor chip 1 and the flip-chip mounting substrate 20. In the present embodiment, arrangement of the underfill resin 35 with respect to the bonding position between the central Au bump 3 and the central pad 28 will be described.

As previously explained, the bonding position between the central Au bump 3 and the central pad 28 corresponds to a central position of the semiconductor chip 1, which is separate from the outer peripheral edge 1b of the semiconductor chip 1 where the underfill resin 35 is filled from. As a consequence, the underfill resin 35 filled from the outer peripheral edge 1b flows up to the central position of the semiconductor chip 1, and thereafter, this underfill resin 35 seals the bonding position between the central Au bump 3 and the central pad 28. (Refer to FIGS. 11A and 11B)

Figure 7A:
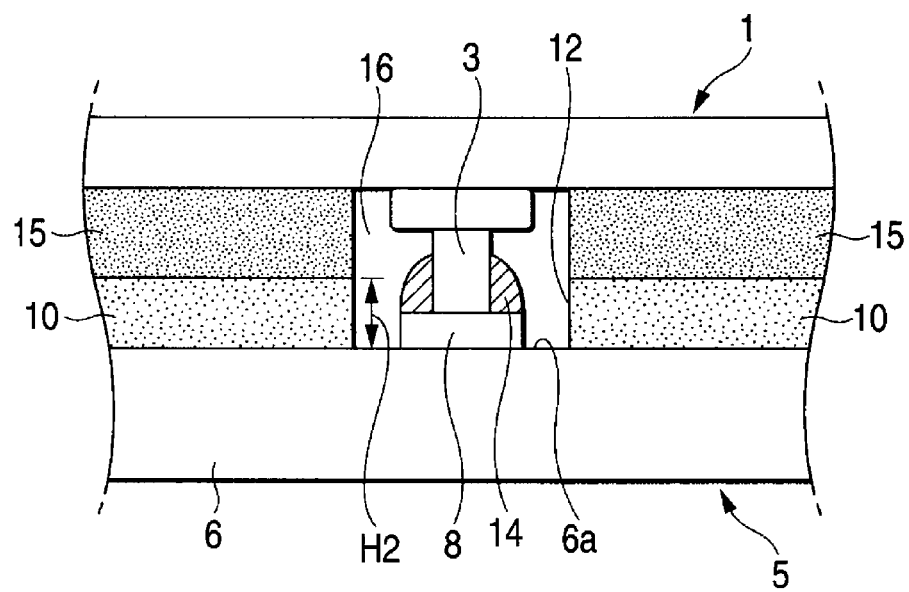
FIG. 7A is a diagram for showing such a condition that an underfill resin is provided to the flip-chip mounting substrate as one example of the related art, and is a sectional view near the central pad.
Figure 7B:
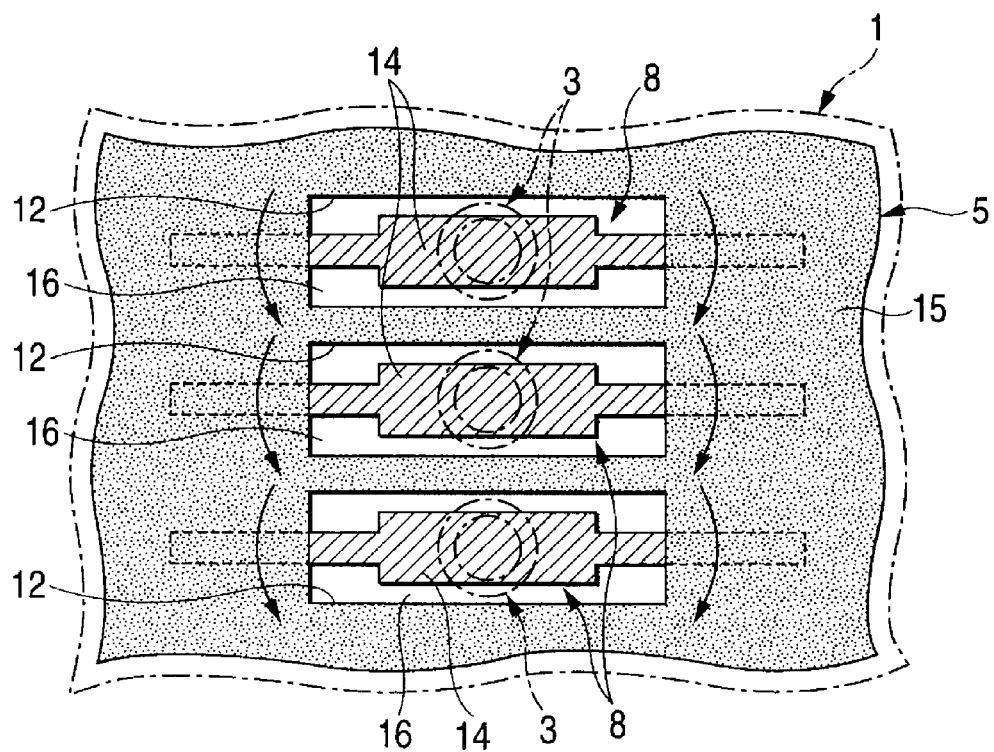
FIG. 7B is a diagram for showing such a condition that an underfill resin is provided to the flip-chip mounting substrate as one example of the related art, and is a plan view near the central pad.

As explained by using FIGS. 7A and 7B, in the flip-chip mounting method using the flip-chip mounting substrate 5 of the related art, since the separated portion 6a is formed between the central pad 8 and the solder resist 10, the depth of the central opening portion 12 is the depth H2, which is the same as the thickness of the solder resist 10. As a consequence, even when the underfill resin 15 reaches the bonding position between the central Au bump 3 and the central pad 8, the underfill resin 15 does not flow into the internal portion of the central opening portion 12, so that the void 16 is generated, as previously explained.

To the contrary, in the flip-chip mounting substrate 20 according to this embodiment, the edge portion of the solder resist 30 is partially overlapped with the outer peripheral portion of the central pad 28 at the position where the central opening portion 32 is formed. As a consequence, the depth H1 (refer to FIG. 8A) of the central opening portion 32 becomes such a depth defined from the upper face of the solder resist 30 up to the upper face of the central pad 28. Thus, this depth H1 of the central opening portion 32 can be made shallower than the depth H2 (refer to FIG. 4A) defined from the upper face of the solder resist 10 up to the surface of the substrate main body 6 in the related art (H1<H2).

Accordingly, the central opening portion 32 can be filled up with the solder 37, and it is possible to avoid the generation of a concave (opened portion) around the bonding position of the central Au bump 3 and the central pad 28 in the solder resist 30. As a consequence, the underfill resin 35 which is filled from the outer peripheral edge 1b of the semiconductor chip 1 and thereafter flown up to the bonding position of the central Au bump 3 and the central pad 28 perfectly seal the bonding position of the central Au bump 3 and the central pad 28.

Next, a flip-chip mounting substrate 40 according to a second embodiment of the invention will be described.

Figure 12A:
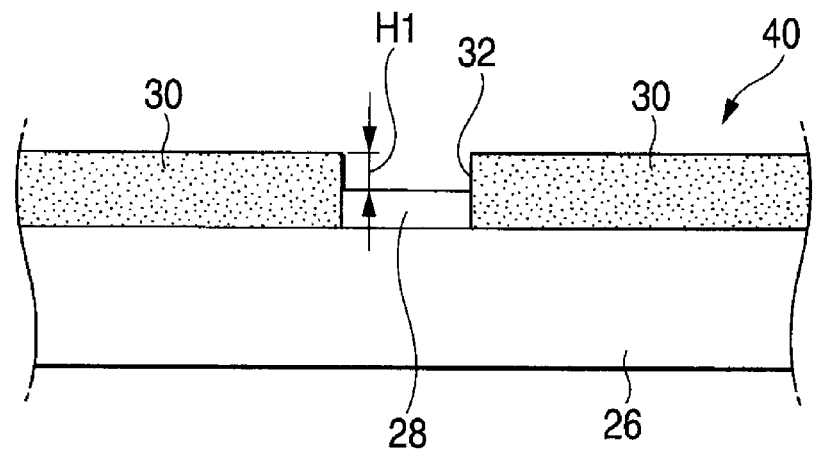
FIG. 12A is a diagram for explaining a structure of a flip-chip mounting substrate according to a second embodiment of the present invention, and is a sectional view near a central pad.
Figure 12B:
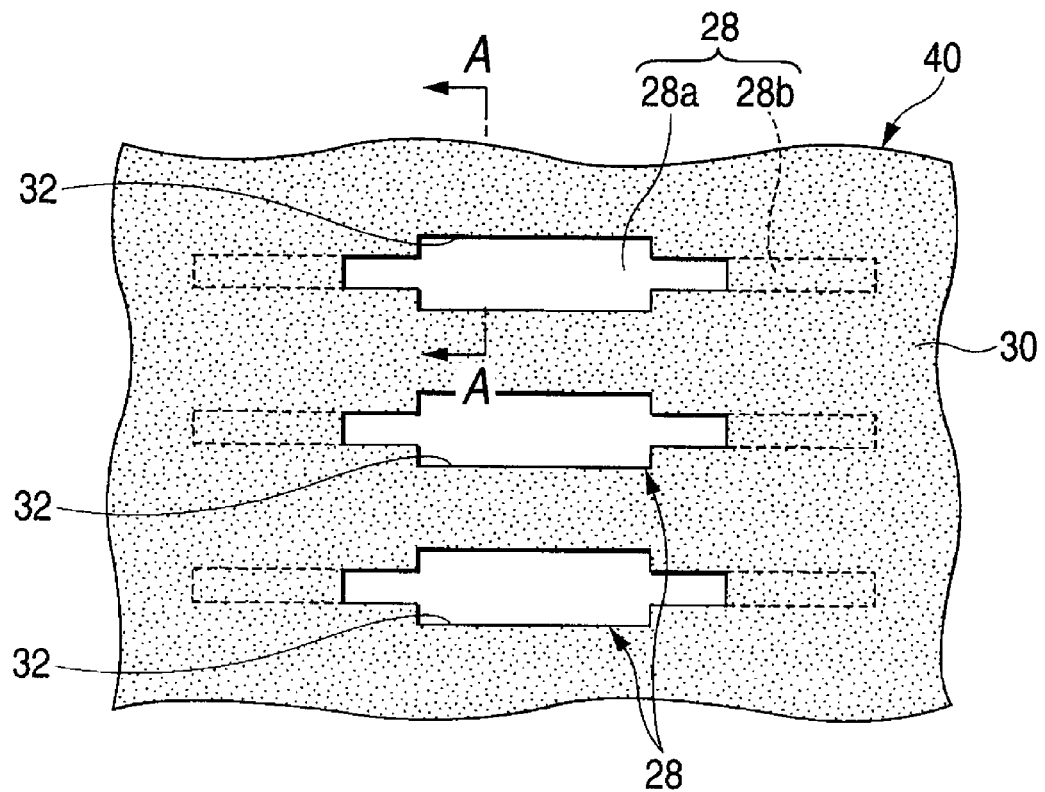
FIG. 12B is a diagram for explaining a structure of a flip-chip mounting substrate according to a second embodiment of the present invention, and is a plan view near the central pad.
Figure 13A:
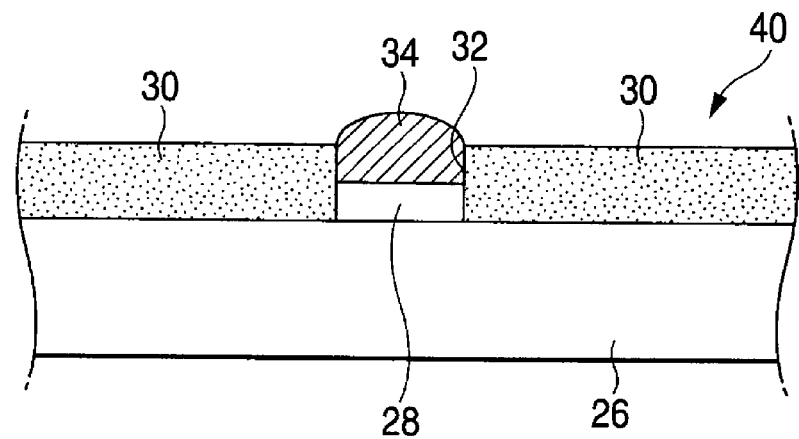
FIG. 13A is a diagram for showing such a condition that a solder is provided on the central pad of the flip-chip mounting substrate according to a second embodiment of the present invention, and is a sectional view near the central pad.
Figure 13B:
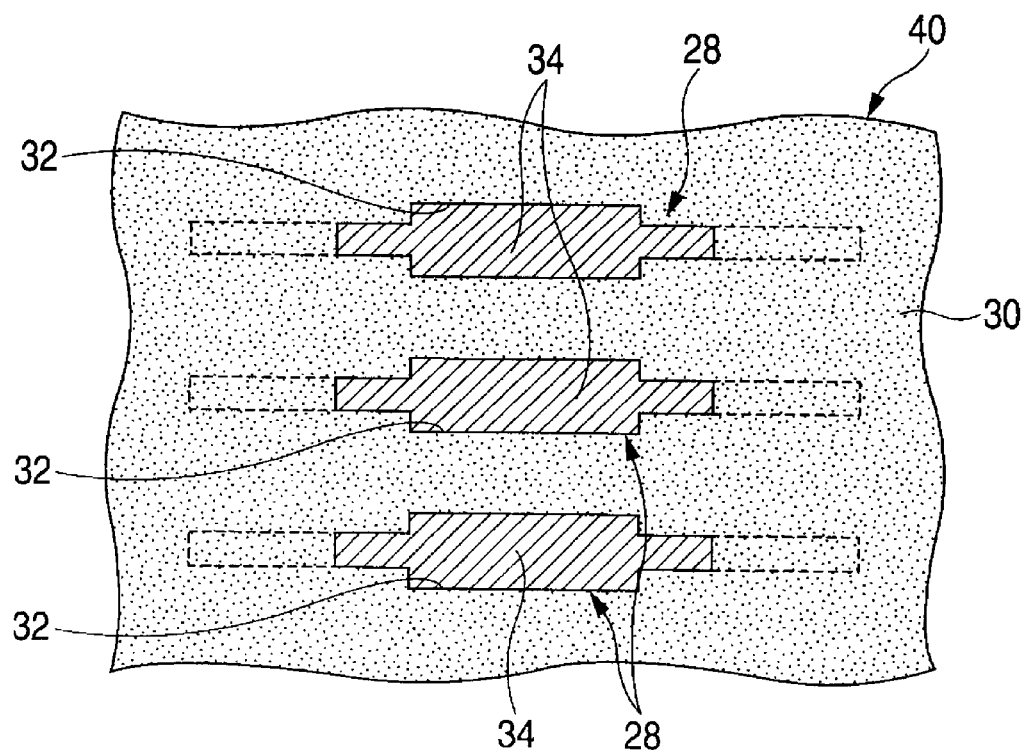
FIG. 13B is a diagram for showing such a condition that a solder is provided on the central pad of the flip-chip mounting substrate according to a second embodiment of the present invention, and is a plan view near the central pad.

FIGS. 12A and 12B show the flip-chip mounting substrate 40 according to the second embodiment of the present invention. This flip-chip mounting substrate 40 corresponds to such a substrate on which the semiconductor chip 1 that is manufactured in high density by forming the outer peripheral Au bumps 2 and the central Au bumps 3 on the circuit formed surface 1a is flip-chip mounted, similarly as the flip-chip mounting substrate 20 according to the first embodiment.

FIG. 12A is a sectional view of the flip-chip mounting substrate 40, taken along a line A-A of FIG. 12B. In a structure shown in FIGS. 12A and 12B, same reference numerals are denoted as to the structure corresponding to the structure of the flip-chip mounting substrate 20 according to the first embodiment as shown in FIGS. 8A and 8B, and the explanation thereof is partially omitted.

The flip-chip mounting substrate 40 according to the present embodiment basically has the same structure as the flip-chip mounting substrate 20 according to the first embodiment. That is, the flip-chip mounting substrate 40 is mainly provided with a substrate main body 26, central pads 28, a solder resist 30, and so on.

The substrate main body 26 is made of a resin material, and wiring patterns are formed on an upper portion of this substrate main body 26. The solder resist 30 is formed on the upper face of the substrate main body 26, and a plurality of central opening portions 32 are formed at the central position of the substrate main body 26. The central pad 28 is externally exposed at the position where the central opening portion 32 is formed.

Here, a positional relationship between the central pad 28 and an edge portion forming the central opening portion 32 of the solder resist 30 is described, which is a difference between the flip-chip mounting substrate 20 according to the first embodiment and the flip-chip mounting substrate 40 according to the second embodiment.

In the flip-chip mounting substrate 20 according to the first embodiment, the edge portion forming the central opening portion 32 of the solder resist 30 is partially overlapped with the outer peripheral portion of the central pad 28 (Refer to FIG. 8A). On the other hand, in the flip-chip mounting substrate 40 according to the present embodiment, it is the same in that the edge portion forming the central opening portion 32 is positioned on the central pad 28. However, in the present embodiment, in particular, the edge portion of the central opening portion 32 of the solder resist 30 corresponds with (substantially in contact with) the outer peripheral edge of the central pad 28.

By this structure, the edge portion of the central opening portion 32 of the solder resist 30 and the outer peripheral edge of the central pad 28 are arranged linearly from a side face view (Refer to FIG. 12A). Further, also in the present embodiment, a depth (indicated by arrow H1 in FIG. 12A) of the central opening portion 32 becomes such a depth defined from the upper face of the solder resist 30 up to the upper face of the central pad 28. Thus, this depth of the central opening portion 32 can be made shallower than the depth H2 (refer to FIG. 4A) defined from the upper face of the solder resist 10 up to the surface of the substrate main body 6 in the related art (H1<H2).

Next, a description is made of a method for manufacturing the flip-chip mounting substrate 40 and a method for flip-chip mounting the semiconductor chip 1 on the flip-chip mounting substrate 40, by using the flip-chip mounting substrate 40 of the present embodiment.

FIG. 13A to FIG. 15B are drawings for explaining the method for manufacturing the flip-chip mounting substrate 40 and the method for flip-chip mounting the semiconductor chip 1 on the flip-chip mounting substrate 40. In FIG. 13A to FIG. 15B, the same reference numerals shown in FIG. 9A to FIG. 11B will be employed as those for denoting the same structural elements in FIG. 13A to FIG. 15B, and therefore, explanations thereof are partially omitted.

In a manufacturing process of the flip-chip mounting substrate 40, in order to form the central opening portion 32 in the solder resist 30, the central opening portion 32 having the edge portion that corresponds with the outer peripheral edge of the central pad 28, a screen printing method or a photographic method, etc., is employed in a process of forming the solder resist 30 on the substrate main body 26.

In the screen printing, the solder resist 30 is formed by printing and forming a solder resist material on the substrate main body 26 by using a mask in which a pattern corresponding to the central opening portion 32 is formed. On the other hand, in the photographic method, a photosensitive solder resist material is provided on the entire face of the substrate main body 26, and the photosensitive solder resist material is exposed and processed by using a mask in which a pattern corresponding to the central opening portion 32 is formed, thereby forming the solder resist 30.

In these methods of forming the solder resist 30, patterning of the solder resist 30 is possible in high accuracy. Thus, the edge portion of the central opening portion 32 of the solder resist 30 and the outer peripheral edge of the central pad 28 can correspond with each other (can be substantially in contact with each other). Further, these forming method are generally employed as a semiconductor manufacturing technology, thus the process of forming the central opening portion in the solder resist 30, which has the edge portion corresponding to (substantially in contact with) the outer peripheral edge of the central pad 28, can be performed easily as low cost.

In flip-chip mounting the semiconductor chip 1 on the flip-chip mounting substrate 40 manufactured as described above, the solder 34 as the bonding material is firstly provided on the upper face of the central pad 28. This solder 34 is provided over an entire face (including both wide width portion 28a and narrow width portion 28b) of the central pad 28. (Refer to FIGS. 13A and 13B)

Under the condition that this solder 34 is provided, in this embodiment, the central opening portion 32 is completely filled up with the solder 34 (namely, central opening portion 32 is infilled). At this time, the flip-chip mounting substrate 40 according to the present embodiment has a structure, in which the edge portion of the central opening portion 32 of the solder resist 30 and the outer peripheral edge of the central pad 28 correspond with each other (substantially in contact with each other).

Therefore, even though the shape of the central pad 28 has the same area in the flip-chip mounting substrates 20 and 40 according to the first and second embodiments, the area of the central pad 28 being exposed from the central opening portion 32 is larger in the present embodiment. Thus, by the present embodiment, amount of the solder 34 being provided can be made larger as compared with the first embodiment.

Subsequently, application of heat and pressure is performed from a back surface of the semiconductor chip 1, and heat is transferred to the solder 34 via the central Au bump 3 so that the solder 34 melts. Then, the central Au bump 3 is flip-chip bonded to the central pad 28 via the solder 34.

Figure 14A:
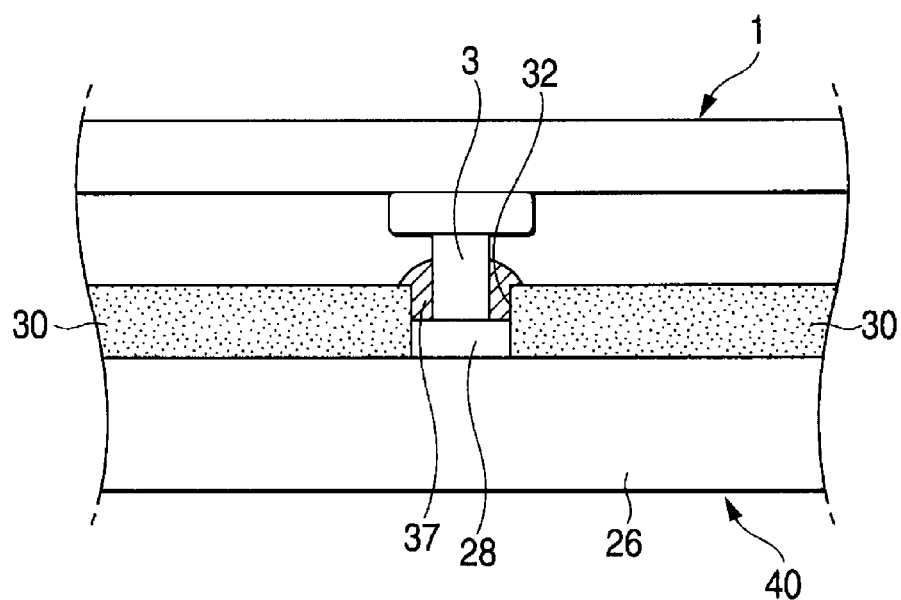
FIG. 14A is a diagram for showing such a condition that the central Au bump is bonded to the flip-chip mounting substrate according to a second embodiment of the invention, and is a sectional view near the central pad.
Figure 14B:
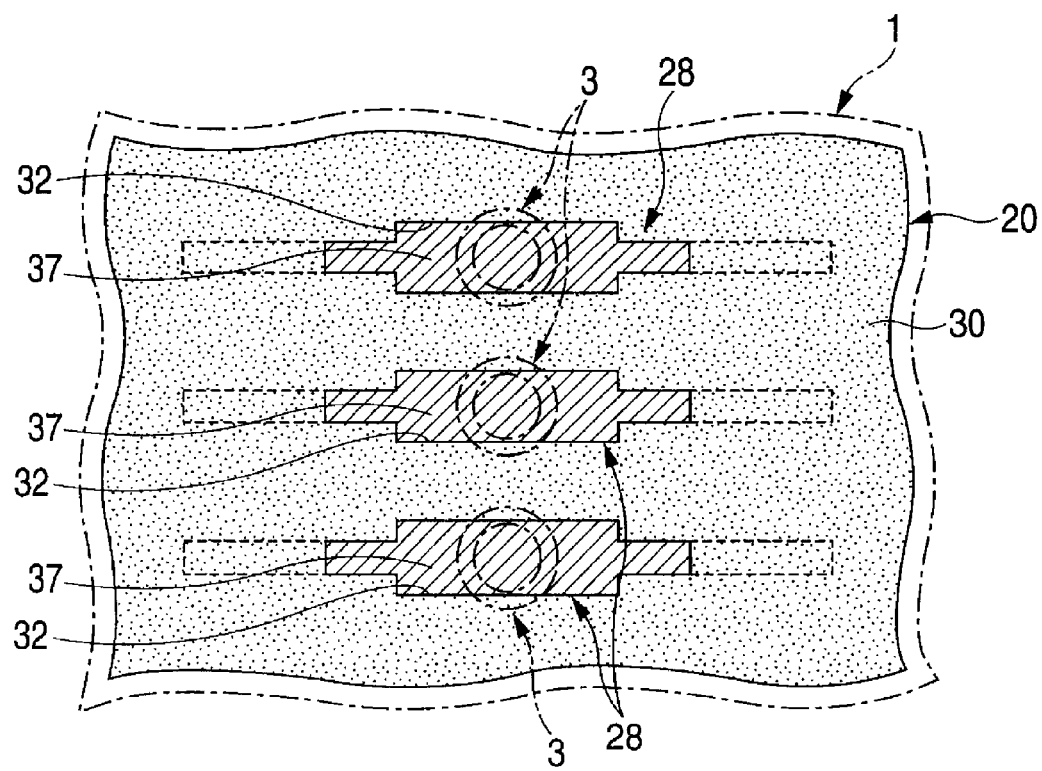
FIG. 14B is a diagram for showing such a condition that the central Au bump is bonded to the flip-chip mounting substrate according to a second embodiment of the invention, and is a plan view near the central pad.
Figure 15A:
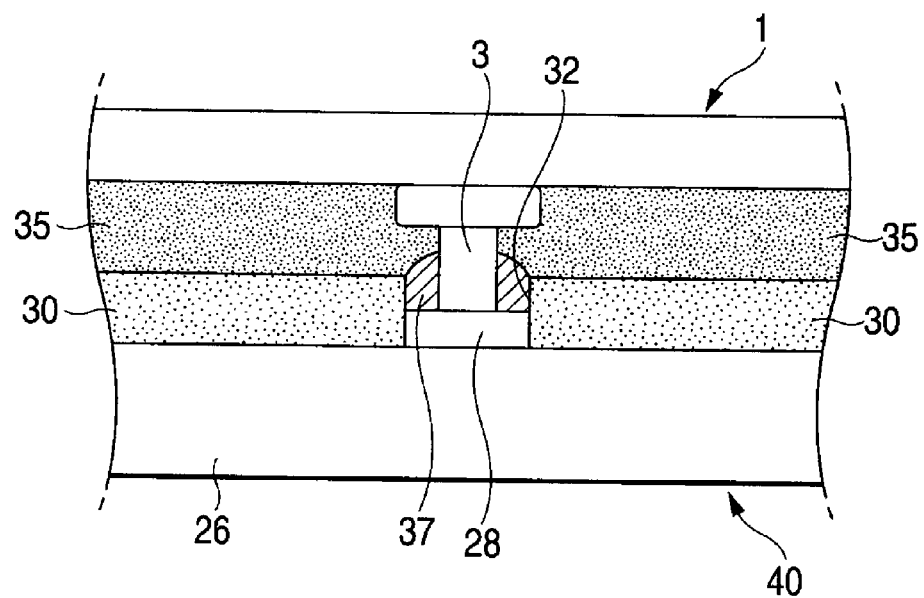
FIG. 15A is a diagram for showing such a condition that an underfill resin is provided to the flip-chip mounting substrate according to a second embodiment of the invention, and is a sectional view near the central pad.
Figure 15B:
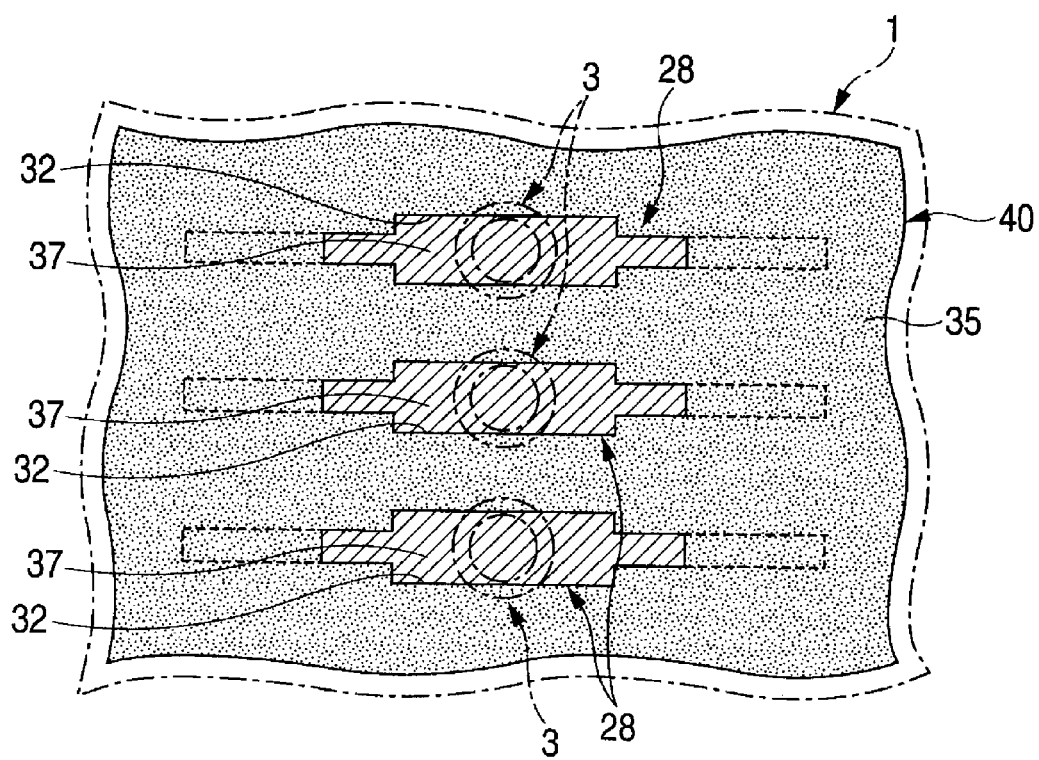
FIG. 15B is a diagram for showing such a condition that an underfill resin is provided to the flip-chip mounting substrate according to a second embodiment of the invention, and is a plan view near the central pad.

As a result, as represented in FIGS. 14A and 14B, the semiconductor chip 1 is flip-chip mounted on the flip-chip mounting substrate 40. In addition, flip-chip bonding of the central Au bump 3 and the central pad 28 may be performed by a reflow process by using a solder paste.

As described above, in the present embodiment, exposed area of the central pad 28 can be increased. Thus, the amount of the solder 34 being provided is made larger. Therefore, a volume of the solder 37 bonding the central Au bump 3 and the central pad 28 becomes larger, then the central Au bump 3 and the central pad 28 can be solder-bonded reliably.

As explained above, when the semiconductor chip 1 is flip-chip mounted on the flip-chip mounting substrate 40, an underfill resin 35 is subsequently provided to a separated portion (gap) between the semiconductor chip 1 and the flip-chip mounting substrate 40.

Also in the present embodiment, the bonding position between the central Au bump 3 and the central pad 28 corresponds to a central position of the semiconductor chip 1. As a consequence, the underfill resin 35 filled from the outer peripheral edge 1b of the semiconductor chip 1 flows up to the central position of the semiconductor chip 1, and thereafter, this underfill resin 35 seals the bonding position between the central Au bump 3 and the central pad 28. (Refer to FIGS. 15A and 15B)

However, in the flip-chip mounting substrate 40 according to the present invention, the edge portion of the central opening portion 32 of the solder resist 30 corresponds with (substantially contacts with) the outer peripheral edge of the central pad 28. Thus, in the flip-chip mounting substrate 40 according to this embodiment, similarly as the flip-chip mounting substrate 20 according to the first embodiment, the depth H1 (refer to FIG. 12A) of the central opening portion 32 becomes such a depth defined from the upper face of the solder resist 30 up to the upper face of the central pad 28. Thus, this depth H1 of the central opening portion 32 can be made shallower than the depth H2 (refer to FIG. 4A) defined from the upper face of the solder resist 10 up to the surface of the substrate main body 6 in the related art (H1<H2).

Accordingly, also in the present embodiment, the central opening portion 32 can be filled up with the solder 37, and it is possible to avoid the generation of a concave (opened portion) around the bonding position of the central Au bump 3 and the central pad 28 in the solder resist 30. As a consequence, the underfill resin 35 which is filled from the outer peripheral edge 1b of the semiconductor chip 1 and thereafter flown up to the bonding position of the central Au bump 3 and the central pad 28 perfectly seal the bonding position of the central Au bump 3 and the central pad 28.

Accordingly, by performing the flip-chip mounting by using the flip-chip mounting substrate 20, 40 according to the first and the second embodiment, it is possible to avoid the generation of voids in particular at the bonding positions between the central Au bumps 3 and the central pads 28, which are located at the center of the semiconductor chip 1.

Also, as a result, even in such a case where the thermal application is carried out after the flip-chip mounting operation, since the generation of voids is suppressed, it is possible to prevent the bonding between the central Au bump 3 and the central pad 28 from being damaged due to the expansion of voids as in the related art, and to prevent the generation of cracks in the solder resist 30 and the underfill resin 35. Therefore, the mounting reliability can be improved.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A flip-chip mounting method for flip-chip mounting an electronic element on which an Au bump is provided, the flip-chip mounting method comprising:
   providing a flip-chip mounting substrate, comprising:
      a substrate main body,
      a connecting pad provided on the substrate main body and to which the Au bump provided on the electronic element is flip-chip bonded, and
      a solder resist on the substrate main body, the solder resist having an opening portion for exposing the connecting pad, wherein an edge portion of the opening portion is partially overlapped with an outer peripheral portion of the connecting pad;
   providing an electrically conductive bonding material on the connecting pad which is exposed from the opening portion formed in the solder resist of the flip-chip mounting substrate;
   bonding the Au bump and the connecting pad with the bonding material so that the bonding material secures and electrically connects the Au bump and the connecting pad together and the electronic element is mounted on the flip-chip mounting substrate, said bonding material and bump cooperating to fill the opening portion in the solder resist and cover a surface of the connecting pad; and
   filling a gap between the electronic element and the flip-chip mounting substrate with an underfill resin while the bump and bonding material cooperate to prevent the underfill resin from flowing into the opening portion.

2. A flip-chip mounting method for flip-chip mounting an electronic element on which an Au bump is provided, the flip-chip mounting method comprising:
   providing a flip-chip mounting substrate, comprising:
      a substrate main body,
      a connecting pad provided on the substrate main body and to which the Au bump provided on the electronic element is flip-chip bonded, and
      a solder resist on the substrate main body, the solder resist having an opening portion for exposing the connecting pad, wherein an edge portion of the opening portion is in direct contact with an outer peripheral portion of the connecting pad;
   providing a bonding material on the connecting pad which is exposed from the opening portion formed in the solder resist of the flip-chip mounting substrate;
   bonding the Au bump and the connecting pad via the bonding material so as to mount the electronic element on the flip-chip mounting substrate, said Au bump extending into said opening portion and said bonding material and bump cooperating to fill the opening portion in the solder resist and cover a surface of the connecting pad; and
   filling a gap between the electronic element and the flip-chip mounting substrate with an underfill resin while the bump and bonding material cooperate to prevent the underfill resin from flowing into the opening portion.

3. The flip-chip mounting method as claimed in claim 1, wherein the bonding material fills up the opening portion formed in the solder resist when the Au bump and the connecting pad are bonded.

4. The flip-chip mounting method as claimed in claim 2, wherein the bonding material fills up the opening portion formed in the solder resist when the Au bump and the connecting pad are bonded.

5. The flip-chip mounting method as claimed in claim 2, wherein the bonding material is conductive.

6. The flip-chip mounting method as claimed in claim 2, wherein the bonding material secures and electrically connects the Au bump and the connecting pad together.

\* \* \* \* \*